(12) United States Patent
Li

(10) Patent No.: US 12,293,986 B2
(45) Date of Patent: May 6, 2025

(54) METHOD FOR FORMING CHIP PACKAGES AND A CHIP PACKAGE

(71) Applicant: Yibu Semiconductor Co., Ltd., Shanghai (CN)

(72) Inventor: Weiping Li, Shanghai (CN)

(73) Assignee: Yibu Semiconductor Co., Ltd., Shanghai (CN)

( * ) Notice: Subject to any disclaimer, the term of this patent is extended or adjusted under 35 U.S.C. 154(b) by 49 days.

(21) Appl. No.: 17/542,416

(22) Filed: Dec. 4, 2021

(65) Prior Publication Data
US 2022/0181296 A1    Jun. 9, 2022

(30) Foreign Application Priority Data

Dec. 4, 2020   (CN) .......................... 202011408981.5
Dec. 4, 2020   (CN) .......................... 202011411137.8
Dec. 4, 2020   (CN) .......................... 202011412884.3

(51) Int. Cl.
*H01L 25/065*   (2023.01)
*H01L 21/48*    (2006.01)
(Continued)

(52) U.S. Cl.
CPC ........ *H01L 25/0655* (2013.01); *H01L 21/486* (2013.01); *H01L 21/561* (2013.01);
(Continued)

(58) Field of Classification Search
CPC . H01L 25/0655; H01L 21/486; H01L 21/561; H01L 21/568; H01L 23/3107;
(Continued)

(56) References Cited

U.S. PATENT DOCUMENTS 10,593,641 B2   3/2020   Qiu et al.
10,651,126 B2   5/2020   Hsiung et al.
(Continued)

FOREIGN PATENT DOCUMENTS

CN   104218022      12/2014
CN   104617072 A     5/2015
(Continued)

OTHER PUBLICATIONS

Shanghai Yibu Semiconductor Co., Ltd., CN the First Office Action, CN 202011411137.8, Jun. 22, 2021, 10 pgs.
(Continued)

*Primary Examiner* — Timor Karimy
(74) *Attorney, Agent, or Firm* — USCH Law, PC

(57) ABSTRACT

The present application provides a method for forming chip packages and a chip package. The method comprises arranging a plurality of interconnect devices at intervals on a surface of a carrier and assembling a plurality of chipsets over the interconnect devices. Each chipset comprises at least two chips electrically connected through an interconnect device. A front surface of each chip facing the carrier is provided with a plurality of first bumps. The method further comprises forming a molded package layer whereby the plurality of chipsets and the plurality of interconnect devices are embedded in the molded package layer; removing the carrier and thinning the molded package layer to expose the first bumps; forming second bumps on the surface on one side of the molded package layer where the first bumps are exposed; and dicing the molded package layer to obtain a plurality of package units. Thus, a flexible and low-cost packaging scheme is provided for multi-chip interconnection.

17 Claims, 2 Drawing Sheets

(51) Int. Cl.
*H01L 21/56* (2006.01)
*H01L 23/00* (2006.01)
*H01L 23/31* (2006.01)
*H01L 23/48* (2006.01)
*H01L 23/498* (2006.01)

(52) U.S. Cl.
CPC ........ *H01L 21/568* (2013.01); *H01L 23/3107* (2013.01); *H01L 23/481* (2013.01); *H01L 23/49827* (2013.01); *H01L 23/4985* (2013.01); *H01L 24/16* (2013.01); *H01L 24/48* (2013.01); *H01L 24/73* (2013.01); *H01L 24/81* (2013.01); *H01L 24/82* (2013.01); *H01L 24/95* (2013.01); *H01L 24/96* (2013.01); *H01L 2224/16157* (2013.01); *H01L 2224/16227* (2013.01); *H01L 2224/81143* (2013.01); *H01L 2224/81203* (2013.01); *H01L 2224/8212* (2013.01); *H01L 2224/82203* (2013.01); *H01L 2224/95001* (2013.01); *H01L 2924/10253* (2013.01); *H01L 2924/10272* (2013.01); *H01L 2924/10329* (2013.01); *H01L 2924/1033* (2013.01); *H01L 2924/15311* (2013.01)

(58) Field of Classification Search
CPC ............. H01L 23/481; H01L 23/49827; H01L 23/4985; H01L 24/16; H01L 24/48; H01L 24/73; H01L 24/81; H01L 24/82; H01L 24/95; H01L 24/96; H01L 2224/16157; H01L 2224/16227; H01L 2224/81143; H01L 2224/81203; H01L 2224/8212; H01L 2224/82203; H01L 2224/95001; H01L 2924/10253; H01L 2924/10272; H01L 2924/10329; H01L 2924/1033; H01L 2924/15311; H10B 80/00
See application file for complete search history.

(56) References Cited

U.S. PATENT DOCUMENTS

| | | | |
|---|---|---|---|
| 10,796,999 | B2 | 10/2020 | Koh et al. |
| 10,903,166 | B2 | 1/2021 | Ganesan et al. |
| 11,075,166 | B2 | 7/2021 | Li et al. |
| 2006/0284292 | A1 | 12/2006 | Cheng |
| 2007/0023919 | A1 | 2/2007 | Lin |
| 2007/0205520 | A1 | 9/2007 | Chou |
| 2008/0284048 | A1 | 11/2008 | Kim et al. |
| 2009/0020323 | A1 | 1/2009 | Chen et al. |
| 2011/0068459 | A1* | 3/2011 | Pagaila ................. H01L 21/56 257/E23.141 |
| 2011/0084386 | A1 | 4/2011 | Pendse |
| 2012/0061856 | A1 | 3/2012 | Vora |
| 2012/0241949 | A1 | 9/2012 | Sasaki |
| 2013/0147032 | A1 | 6/2013 | Jeng |
| 2015/0163904 | A1 | 6/2015 | Karhade et al. |
| 2015/0228551 | A1 | 8/2015 | Oi et al. |
| 2016/0143139 | A1 | 5/2016 | Jeng |
| 2017/0287870 | A1 | 10/2017 | Fang et al. |
| 2019/0006281 | A1 | 1/2019 | Georg et al. |
| 2019/0115319 | A1 | 4/2019 | Hiner |
| 2019/0157205 | A1 | 5/2019 | Deshpande et al. |
| 2020/0020634 | A1 | 1/2020 | Tsai |
| 2020/0035603 | A1* | 1/2020 | Rubin ................. H01L 21/6835 |
| 2020/0051949 | A1 | 2/2020 | Tsai et al. |
| 2020/0075546 | A1 | 3/2020 | Shih et al. |
| 2020/0176384 | A1 | 6/2020 | Wu et al. |
| 2020/0176410 | A1 | 6/2020 | Qiu et al. |
| 2020/0243449 | A1 | 7/2020 | Chiang et al. |
| 2020/0303364 | A1 | 9/2020 | Chen et al. |
| 2020/0312767 | A1 | 10/2020 | Pietambaram et al. |
| 2020/0335443 | A1 | 10/2020 | Zhou et al. |
| 2021/0020605 | A1 | 1/2021 | Hiner |
| 2022/0199539 | A1 | 6/2022 | Karhade |

FOREIGN PATENT DOCUMENTS

| | | | |
|---|---|---|---|
| CN | 107017238 A | 8/2017 | |
| CN | 110197793 A | 9/2019 | |
| CN | 110707075 A | 1/2020 | |
| EP | 3751607 | * 3/2020 | ......... H01L 21/4853 |
| TW | 200943440 A | 10/2009 | |
| TW | 201535667 A | 9/2015 | |
| TW | 202006842 A | 2/2020 | |
| TW | 202015194 A | 4/2020 | |
| TW | 202029449 A | 8/2020 | |
| TW | I715257 B | 1/2021 | |
| TW | 202135243 A | 9/2021 | |

OTHER PUBLICATIONS

Shanghai Yibu Semiconductor Co., Ltd., CN the Second Office Action, CN 202011411137.8, Sep. 14, 2021, 6 pgs.
Shanghai Yibu Semiconductor Co., Ltd., TW the First Office Action and Search Report, TW 110145135, Nov. 28, 2022, 9 pgs.
Shanghai Yibu Semiconductor Co., Ltd., TW the Second Office Action, TW 110145135, Jul. 31, 2023, 8 pgs.
Shanghai Yibu Semiconductor Co., Ltd., CN the First Office Action, CN 202011408981.5, Jun. 18, 2021, 10 pgs.
Shanghai Yibu Semiconductor Co., Ltd., CN the Second Office Action, CN 202011408981.5, Aug. 25, 2021, 9 pgs.
Shanghai Yibu Semiconductor Co., Ltd., CN the Third Office Action, CN 202011408981.5, Nov. 9, 2021, 13 pgs.
Shanghai Yibu Semiconductor Co., Ltd., TW the Second Office Action, TW 110145134, Dec. 21, 2022, 16 pgs.
Shanghai Yibu Semiconductor Co., Ltd., English Translation of KR First Office Action, KR10-2021-0171478, Dec. 3, 2021, 6 pgs.
Shanghai Yibu Semiconductor Co., Ltd., CN the First Office Action, CN 202011412884.3, Jun. 17, 2021, 14 pgs.
Shanghai Yibu Semiconductor Co., Ltd., TW the First Office Action, TW 110145240, Jun. 1, 2022, 3 pgs.
Shanghai Yibu Semiconductor Co., Ltd., English Translation of KR First Office Action, KR 10-2021-0171482, Dec. 3, 2021, 5 pgs.
Weiping Li, U.S. Appl. No. 17/542,415, Non-Final Office Action issued Jun. 8, 2023.
Weiping Li, U.S. Appl. No. 17/542,415, Final Office Action issued Dec. 4, 2023.

* cited by examiner

METHOD FOR FORMING CHIP PACKAGES AND A CHIP PACKAGE

CROSS REFERENCE TO RELATED APPLICATIONS

This application claims the benefit of priority under the Paris Convention to Chinese Patent Application No. CN202011411137.8, filed Dec. 4, 2020, entitled "Method for Forming Chip Packages and a Chip Package," Chinese Patent Application No. CN202011408981.5, filed Dec. 4, 2020, entitled "Chip Interconnecting Method, Interconnect Device and Method for Forming Chip Packages," and Chinese Patent Application No. CN202011412884.3, filed Dec. 4, 2020, entitled "Method for Forming Chip Packages and a Chip Package," each of which is incorporated by reference herein in its entirety. This application is related to co-pending U.S. patent application Ser. No. 17/542,415, entitled "Method for Forming Chip Packages and a Chip Package," filed on even date herewith, and U.S. patent application Ser. No. 17/542,417, entitled "Chip Interconnecting Method, Interconnect Device and Method for Forming Chip Packages," filed on even date herewith, each of which is incorporated by reference herein in its entirety.

FIELD

The present application is related to the field of semiconductors, and particularly to a method for forming chip packages and a chip package.

BACKGROUND

This section is intended to provide a background or context to the invention recited in the claims. The description herein is not admitted to be prior art by inclusion in this section.

With the advent of the artificial intelligence era, the trend of semiconductor integrated circuits is toward more functions and faster computation speeds. Simply following the trend using system-on-chip (SOC) integration on large chips will undoubtedly make circuit design more difficult and more expensive to manufacture. The more practical solution is to use heterogeneous integration technology of multiple chiplets to accomplish functional integration. Based on this, an important task for high-end packaging at present is to develop a high-efficiency and high-density multi-chip interconnection technology, and to replace SOC integration on a large chip by using broadband connections among bare chips to form a physical layer functional block, thereby realizing low cost and high degree of freedom with the same functionality.

In existing multi-chip interconnection technologies, such as embedded multi-chip interconnection bridging (EMIB), a silicon bridge is embedded in a substrate to realize chip interconnection, so that the interconnection density and the interconnection efficiency can be increased. However, conventional EMIB requires a complicated packaging process and is expensive.

SUMMARY

In view of the above problems in existing technologies, a method of forming chip packages and a chip package are provided, with which the above problems can be solved.

In a first aspect, a method of forming chip packages is provided. The method comprises providing a carrier and arranging a plurality of interconnect devices at intervals on a surface of the carrier, each interconnect device having a first side facing away from the carrier. The method further comprises providing a plurality of chipsets and assembling the plurality of chipsets over the plurality of interconnect devices. In some embodiments, a front surface of each chip in each chipset faces the carrier and is provided with a plurality of first bumps, and each chipset includes at least two chips that are joined by a corresponding interconnect device on the first side of the corresponding interconnect device. The at least two chips are thus electrically interconnected through the corresponding interconnect device. The method further comprises forming a molded encapsulation layer around the plurality of chipsets, such that the plurality of chipsets and the plurality of interconnect devices are embedded in the molded encapsulation layer; removing the carrier and thinning the molded encapsulation layer to expose some of the first bumps; forming second bumps on the surface on one side of the molded encapsulation layer where the first bumps are exposed; and dicing the molded encapsulation layer to obtain a plurality of unit packages.

In an embodiment, each chip has a front surface facing the carrier and the front surface has first and second edge regions near opposite edges of the front surface, and solder bumps or solder balls formed in the first and second edge regions. The method further comprises arranging a plurality of self-alignment devices on the first surface of the carrier before assembling the plurality of chip sets over the plurality of interconnect devices. In some embodiments, each self-alignment device is positioned at a dividing position of two adjacent chipsets, so that a chip disposed on either side of the dividing position is self-aligned and bonded to a first surface on the first side of the interconnect device via solder balls in the first edge region of the chip, and concurrently, the second edge region of the chip is self-aligned and bonded to a first surface, facing away from the carrier, of the self-alignment device via the solder balls in the second edge region. As a result, each chip is aligned relative to the carrier.

In an embodiment, dicing the molded encapsulation layer includes cutting the molded encapsulation layer through a line across each self-alignment device and between two adjacent chips to separate adjacent chipsets.

In one embodiment, at least two sets of conductive pads are formed on the first surface of each interconnect device facing away from the carrier, and are used for respectively bonding to the solder bumps in the first edge regions of the at least two chips in the corresponding chipset. In some embodiments, a fan-out circuit is formed on the surface on one side of the interconnect device facing away from the carrier, and the fan-out circuit is used for connecting the at least two groups of conductive pads.

In an embodiment, the interconnect device is formed as a passive device or an active device.

In one embodiment, the interconnect device has vertical interconnect vias.

In one embodiment, the bonding of the at least two chips in any chipset on the first surface of each of the interconnect devices away from the carrier further comprises bonding the at least two chips in each chipset on the first surface of a corresponding interconnect device facing away from the carrier through a thermocompression process. In some embodiments, the interconnect devices are formed as flexible circuits.

In an embodiment, the self-alignment device has similar arrangement and function as the interconnect device. In an embodiment, second bumps are formed on a surface of the molded encapsulation layer, where the first bumps are exposed. In some embodiments, the method further includes forming a redistribution or rewiring layer on the surface of the molded encapsulation layer where the first bumps are exposed, and forming a plurality of second bumps on the rewiring layer.

In an embodiment, second bumps are formed on a surface of the molded encapsulation layer, where the first bumps are exposed, and the method further includes forming a solder sealing layer on the surface on one side of the molded encapsulation layer where the first bumps are exposed. In some embodiments, the solder sealing layer includes second bumps.

In a second aspect, a package is provided, comprising at least two chips and an interconnect device. In some embodiments, the at least two chips are adjacently arranged side by side, a plurality of first bumps are arranged on a front surface of each chip, and a first surface of the interconnect device is jointed to portions of the front surfaces of the at least two chips, whereby the at least two chips are electrically connected through the interconnect device. In some embodiments, the at least two chips and the interconnect device are embedded in a molded encapsulation layer, and the first bumps of the at least two chips are exposed on the surface on one side of the molded encapsulation layer; and the plurality of second bumps are formed on the surface on one side of the molded encapsulation layer, where the first bumps are exposed.

In an embodiment, each chip has a front surface facing the interconnect device and the front surface has first and second edge regions near opposite edges of the front surface, and solder bumps or solder balls are formed in the first and second edge regions. The package further comprises a self-alignment device having opposing pad surface and insulation surface. The insulation surface is on the surface of the molded encapsulation layer, where the first bumps are exposed, and the solder pad surface is embedded inside the molded encapsulation layer. The first edge region of each chip is bonded to the first surface of the interconnect device in a self-aligned manner via solder balls, and the second edge region of each chip is bonded to the solder pad surface of the self-alignment device in a self-aligned manner via solder balls.

In one embodiment, the first surface of the interconnect device facing the at least two chips is formed with at least two sets of conductive pads for respectively bonding to solder bumps in the first edge regions of the at least two chips; and a fan-out circuit is formed on the first surface of the interconnect device facing the at least two chips and used for connecting the at least two groups of conductive bonding pads.

In an embodiment, the interconnect device is formed as an active device or a passive device.

In one embodiment, the interconnect device has vertical interconnect vias.

In one embodiment, the interconnect device is formed as a flexible circuit thermocompressively bonded to the first surfaces of the at least two chips.

In an embodiment, the self-alignment device has the same or similar arrangement and function as the interconnect device.

In an embodiment, the package further comprises a rewiring layer formed on the surface on one side of the molded encapsulation layer where the first bumps are exposed, and a plurality of second bumps are formed on the rewiring layer.

In one embodiment, the plurality of second bumps are formed as a solder sealing layer formed on the surface on one side of the molded encapsulation layer where the first bumps are exposed.

Some embodiments of the present application achieve the same or similar effects as the EMIB technology with lower cost and simpler manufacturing processes by adopting novel package structure designs and unique process flows. The novel package structure designs and unique process flows according to some embodiments do not require embedding interconnect devices in a substrate, thus reducing the complexity and cycle time of design and fabrication. Further, the associated cost of the substrate is eliminated, thereby providing a flexible and low-cost solution for multi-chip attachment.

The above summary is an overview of the technical solutions of some embodiments, which are described in more detail below with reference to drawings in order to make the aforementioned and other objects, features, and advantages comprehensible.

BRIEF DESCRIPTION OF THE DRAWINGS

The advantages and benefits described herein, as well as other advantages and benefits, will be apparent to those of ordinary skill in the art upon reading the following detailed description of some embodiments. The drawings are only for purposes of illustrating exemplary embodiments and are not to be construed as limiting the invention recited in the claims. Also, like reference numerals are used to refer to like elements throughout. In the drawings:

Figure 1:
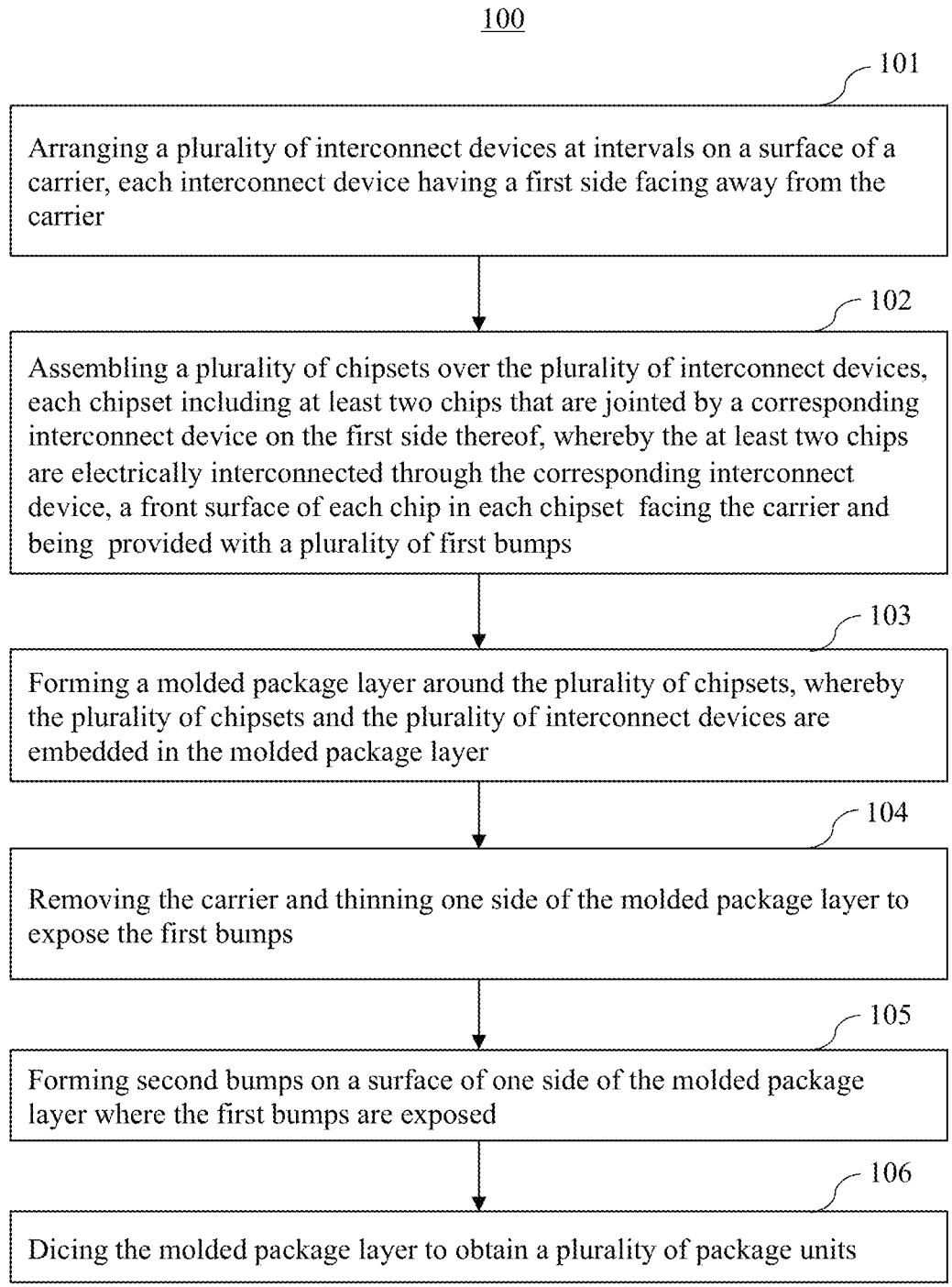
FIG. 1 is a schematic flow chart of a method of forming chip packages according to some embodiments.

1 first set of conductive pads on the first side of interconnect device 11;
2 second set of conductive pads on the first side of interconnect device 11;
3 IO pins on second (bottom) side of interconnect device 11 (see para. [0037]);
4 solder pads on the upper side of self-alignment device 12;
11 interconnect device;
11a first surface of interconnect device 11;
11b second surface of interconnect device 11;
12 self-alignment device;
12a solder pad surface of self-alignment device 12;
12b insulation surface of self-alignment device 12;
15 solder bumps;
20 first bumps;
20a first subset of the first bumps on a chip 21/22;
20b second subset of the first bumps on chip 21/22;
20c third subset of the first bumps on chip 21/22;
21 first chip;
21a front surface of first chip 21;
21b back surface of first chip 21;
22 second chip;
22a front surface of second chip 22;
22b back surface of second chip 22;
30 molded package layer;
40 second bumps;
50 redistribution layer;
55 package;

211 first edge region of first chip 21;
212 second edge region of first chip 21;
221 first edge region of second chip 22; and
222 second edge region of second chip 22.

DETAILED DESCRIPTION OF THE EMBODIMENTS

Certain embodiments of the present disclosure will be described in more detail below with reference to the accompanying drawings. While exemplary embodiments of the present disclosure are shown in the drawings, it should be understood that the present disclosure may be embodied in various forms and should not be limited to the embodiments set forth herein.

The following disclosure provides various embodiments, or examples, for implementing different features of the embodiments. Specific examples of components and arrangements are described below to simplify the present disclosure. These are, of course, merely examples and are not intended to limit the invention. Further, the present application may repeat reference numerals and/or characters in the various embodiments. This repetition is for the purpose of simplicity and clarity and does not in itself dictate a relationship between the various embodiments and/or configurations discussed.

It will be understood that terms such as "including" or "having," or the like, are intended to indicate the presence of the disclosed features, integers, steps, acts, components, parts, or combinations thereof, and are not intended to preclude the presence or addition of one or more other features, integers, steps, acts, components, parts, or combinations thereof.

Also, spatially relative terms, such as "below . . . ," "under . . . ," "down," "above . . . ," "up," and the like, may be used herein for ease of description to describe one element or component's relationship to another element (or other) component as illustrated. Spatially relative terms are intended to encompass different orientations of the device in use or operation in addition to the orientation depicted in the figures. The device may be otherwise oriented (rotated 90 degrees or at other orientations) and the spatially relative descriptors used herein interpreted accordingly.

It should be noted that certain embodiments and/or certain features of the embodiments may be combined with each other without conflict.

FIG. 1 is a flow chart illustrating a method 100 of forming chip packages according to some embodiments. As shown in FIG. 1, the method 100 may include steps 101-106, which are described in further details below.

FIG. 2A-2E illustrate cross-sectional views illustrating various stages in a process of forming chip packages, according to some embodiments.

Figure 2A:
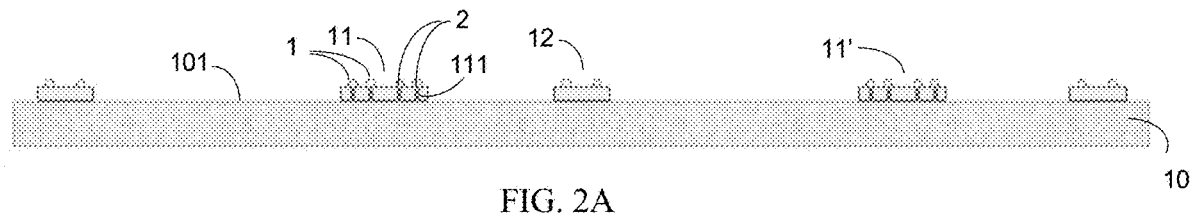
FIGS. 2A to 2E are schematic cross-sectional views illustrating a process of forming chip packages at various stages according to some embodiments, where the following reference numerals are used to refer to various parts of the chip packages formed using the method illustrated in FIG. 1.

Referring first to FIG. 2A, step 101 is performed, in which a carrier 10 is provided, and a plurality of interconnect devices, such as interconnect devices 11 and 11', are arranged at intervals on a first surface 101 of the carrier 10. In some embodiments, the plurality of interconnect devices are arranged equidistantly or at equal intervals (e.g., the gap between any two adjacent interconnect devices is the same or about the same). In some embodiments, the interconnect devices (11, 11') may be formed as passive devices or may be formed as active devices. In some embodiments, the interconnect device (11,11') may be formed as an interconnect device having a vertical interconnect via 111, the vertical interconnect via 111 being a TSV (Through Silicon Vias, Through Silicon Vias 111), such that I/O pins may also be formed on the lower surface of the interconnect device (11, 11') of the package. It should be understood that the interconnect device (11, 11') may of course also be provided without vertical interconnect vias.

Figure 2B:
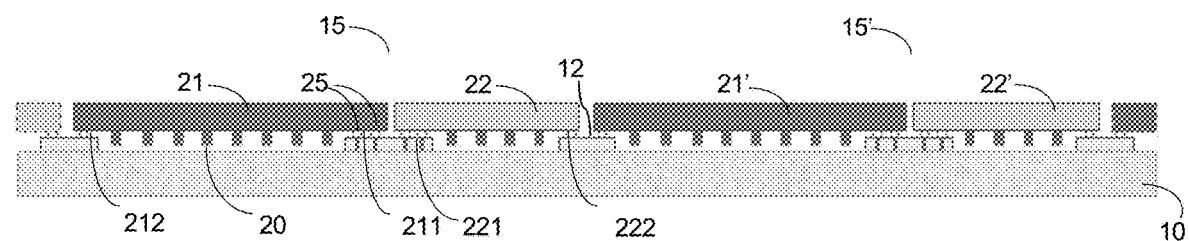

Referring to FIG. 2B, step 102 is performed, in which a plurality of chipsets 15 are assembled over the plurality of interconnect devices 11. In some embodiments, each chipset 15 comprises at least two chips having their respective front surfaces with first bumps formed thereon facing downward (toward the carrier) for bonding to a first surface of a corresponding interconnect device facing away from the carrier so as to enable the at least two chips in each chipset to be electrically connected through the interconnect device. FIG. 2B shows a first chipset 15 and a second chipset 15' are adjacent to each other. In some embodiments, the first chipset may include a first chip 21 and a second chip 22, and the second chipset may include a first chip 21' and a second chip 22'. In some embodiments, the lower surface of each chip has first bumps 20, which may also be referred to as chip pins. The surface of the chip having the chip pins may be referred to as a front surface, and the surface opposite to the front surface may be referred to as a back surface. In a semiconductor package, such a package with chips facing down (toward the external terminals or solder bump) may also be referred to as a face-down package. In some embodiments, the first bumps 20 may be formed as solder bumps made of a conductive material, which may include Cu, Au, or the like, or alloys thereof, as well as other materials. In some embodiments, a chipset packaged together may include multiple chips of the same or different functions, for example, a first chip may be a logic chip, a second chip may be a memory chip, and a chipset may include three or more chips of the same or different functions.

In some embodiments, each chip has on a front surface facing the carrier opposite first and second edge regions and solder bumps 25 are formed in the edge regions. For example, as shown in FIG. 2B, a first chip 21 of the first chipset has opposing first and second edge regions 211, 212 and a second chip 22 of the first chipset has opposing first and second edge regions 221, 222, each of which is provided with bumps 25.

In some embodiments, at least two sets of conductive pads (1, 2) may be formed on a front or first surface of each interconnect device 11 away from the carrier for respectively bonding to the first bumps 25 in the first edge regions (211, 221) of at least two chips in a corresponding chipset; a fan-out circuit is formed on a surface of the interconnect device on a side remote from the carrier for coupling to the at least two sets of conductive pads. For example, a first set of conductive pads 1 and a second set of conductive pads 2 are formed on a surface of the interconnect device 11 on a side away from the carrier, the first set of conductive pads 1 being used for bonding to first bumps 25 formed in the first edge region 211 of the first chip 21, the second set of conductive pads 2 being used for bonding to first bumps 25 formed in the first edge region 221 of the second chip 22, and a fan-out circuit for coupling the first set of conductive pads and the second set of conductive pads is formed for realizing electrical coupling between the first chip 21 and the second chip 22.

In an embodiment, referring to FIG. 2A, before step 102 is performed, a plurality of self-alignment devices may also be arranged at intervals on the first surface 101 of the carrier 10. In some embodiments, the plurality of self-alignment devices are located at predetermined dividing positions of adjacent chipsets. As described above, each chip has opposite first and second edge regions on the front surface facing the carrier. In some embodiments, the first edge region is the region to which the interconnect device is bonded and the second edge region is the region to which the self-alignment device is bonded. Therefore, while the first edge region of a chip on either side of the predetermined dividing position of two adjacent chipsets is bonded to the surface of the side of the interconnect device facing away from the carrier in a self-aligned manner through the solder balls, the second edge region can be bonded to the surface of the side of the self-alignment device facing away from the carrier in a self-aligned manner through the solder balls. For example, the self-alignment device 12 at the boundary position between the first chipset 15 and the second chipset 15' has a left part area of its upper surface for self-alignment with the second edge region of the second chip 22 in the first chipset 15 and a right part area of its upper surface for self-alignment with the second edge region of the first chip 21' in the second chipset 15'.

Figure 2C:
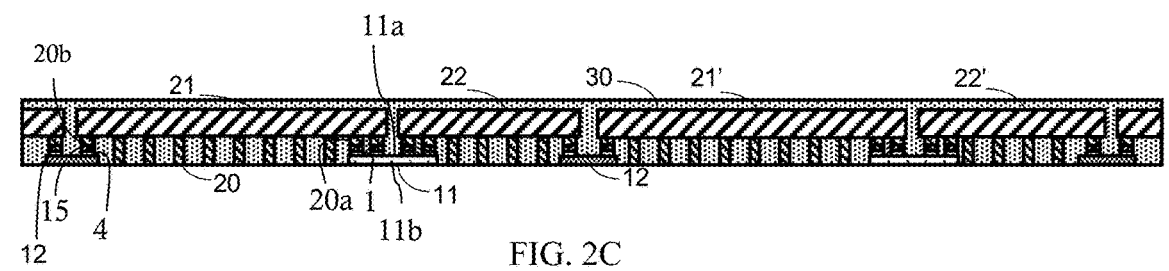

Referring to FIG. 2C, step 103 is performed, in which a molded package layer 30 is formed around the chipsets. In some embodiments, the first chip 11 and the second chip 12 and the interconnect device 13 are embedded in the molded package layer 30. In some embodiments, the material of the molded package layer 30 may include an epoxy, an organic polymer, or a polymer with or without a silicon-based or glass filler. In some embodiments, the material of the molded package layer 30 may include a liquid molding compound that is a gel-type liquid. The molded package layer 30 may also include other insulating and/or encapsulating or other materials.

Next, step 104 is executed, in which the carrier 10 is removed and the molded package layer 30 is thinned to expose some of the first bumps 20 (e.g., the first bumps not covered by the interconnect device). Thinning treatment can be performed on the surface of the side of the molded package layer 30 from which the carrier 10 is removed, so as to expose the first bumps 20 of the first chip and the second chip of each chipset. For example, in some embodiments, a mold release process may be used to remove the carrier 10, and the carrier 10 may also be removed using a laser process or an Ultraviolet (UV) irradiation process. In other embodiments, the carrier 10 and the chip may be coupled using a peelable adhesive material and the carrier 10 may be torn off for removal in step 106. Other methods may also be used to remove the carrier.

After removal of the carrier 10, the backside of the interconnect devices 11 and the self-alignment devices 12 are exposed. In some embodiments, a chemical mechanical polishing process, an etching process, or other methods may be used to remove portions of the molding compound in the thinning process. During or after the thinning process, the first bumps 20 (i.e., the chip pins) of the first and second chips in each chipset may be partially removed, exposing the conductive contact surfaces of the first bumps 20 of the first and second chips.

Figure 2D:
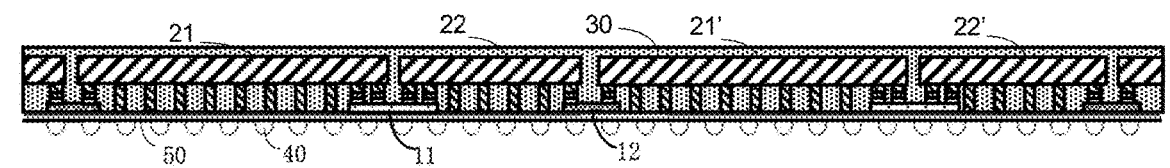

Referring to FIG. 2D, step 105 is performed, in which second bumps 40 are formed on the surface of the molded package layer 30 on the side where the first bumps 20 are exposed.

In some embodiments, a redistribution layer or (RDL) 50 may be formed on a surface of the molded package layer 30 on a side where the metal contact surfaces of the first bumps 20 are exposed, and a plurality of second bumps 40 may be formed on the redistribution layer 50. For example, the redistribution layer 50 may be formed by photolithography and electroplating on a front surface of the molded package layer 30 where the first bumps 20 are exposed. In some embodiments, the dielectric material of the molded package layer 30 may be a photosensitive material, a non-photosensitive material, a liquid material, a dry film material, or the like. In some embodiments, the redistribution layer 50 may not be used, and the second bump 40 may be directly formed on the metal contact surface of the first bumps 20 exposed on the surface of the molded package layer 30, that is, solder bumps of a conductive material is formed on the metal contact surface of the first bumps 20 as the second bump 40. In other embodiments, a solder covering layer (solder capping) may be formed on a surface of the molded package layer 30 on the side where the first bumps 20 are exposed, and the solder covering layer accumulates a plurality of conductive bumps on the surface of the molded package layer 30 on the side where the first bumps 20 are exposed, so as to implement electrical connection between the chip package and external semiconductors.

Figure 2E:
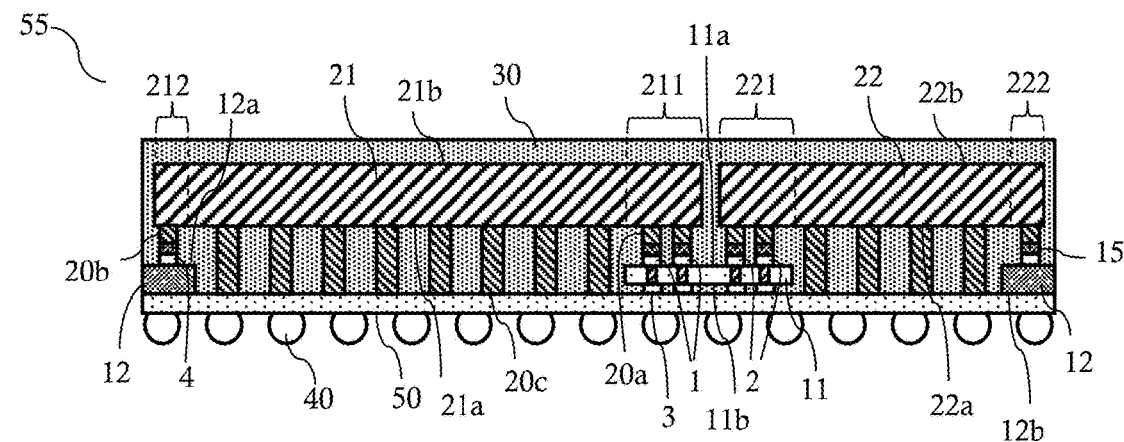

Referring to FIG. 2E, step 106 is performed, in which the molded package layer is diced to obtain a plurality of package units or chip packages 55. In some embodiments, one chip package 55 comprises a chipset.

In some embodiments, the molded package layer may be cut along a line across each self-alignment device 12 in a direction perpendicular to the cross section shown in FIG. 2D to separate adjacent chipsets.

According to various aspects of the above embodiments, the same or similar effects as the EMIB technology are achieved with lower cost and simpler manufacturing process by adopting the novel package structure designs and unique process flows described herein. On the one hand, no interconnect devices need to be embedded in the substrate (substrate), reducing the complexity and cycle time of design and fabrication. On the other hand, the associated cost of the substrate is eliminated, thereby providing a flexible and low-cost solution for multi-chip attachment and packaging.

Referring to FIG. 2E, the present invention also provides a chip package 55 made using the method of the above embodiment.

The chip package 55 comprises at least two chips, such as a first chip 21 and a second chip 22, and further comprises an interconnect device 11. In some embodiments, the at least two chips (21, 22) are adjacently arranged side by side, a plurality of first bumps 20 are arranged on the front surface (21a, 22a) of each chip, and a first surface 11a of the interconnect device 11 is bonded to edge portions (211, 221) of the front surface of the at least two chips (21, 22) provided with the first bumps 20a, so that the at least two chips can be electrically connected through the interconnect device. The chip package further includes a molded package layer 30. In some embodiments, the at least two chips (21, 22) and the interconnect device 11 are embedded in the molded package layer 30, and the first bumps 20 of the at least two chips (21, 22) are exposed on the first surface of the molded package layer; the package further includes a plurality of second bumps 40 formed on a surface of the molded package layer 30 on a side where the first bumps 20 are exposed.

In an embodiment, each chip has opposing first and second edge regions at a front surface facing the interconnect device 11, and the package further comprises a self-alignment device 12, the self-alignment device 12 having opposing pad surface 12a and insulation surface 12b. In some embodiments, the insulation surface 12a is at the first surface of the molded package layer 30 where the first bumps 20 are exposed, and the pad surface 12b is embedded inside the molded package layer. In some embodiments, the first edge region (211, 221) of each chip is bonded to the first surface 11a of the interconnect device, and the second edge region (212, 222) of each chip is self-aligned and bonded to the pad surface 12a of the self-alignment device.

In one embodiment, a front surface 11a of the interconnect device 11 facing the at least two chips (21, 22) is formed with at least two sets of conductive pads (1, 2) for bonding to the bumps 25 in the first edge regions (211, 221) of the at least two chips (21, 22), respectively; a front surface 11a of the interconnect 11 facing the at least two chips (21, 22) is further formed with a fan-out circuit for coupling to the at least two sets of conductive pads.

In an embodiment, the interconnect device is formed as an active device or a passive device.

In one embodiment, the interconnect device has vertical interconnect vias.

In one embodiment, the interconnect device is formed as a flexible circuit that is thermocompressively bonded to the first surface of at least two neighboring chips.

In an embodiment, the package further comprises a redistribution or rewiring layer 50 formed on the surface of the molded package layer 30 on the side where the first bumps 20 are exposed. In some embodiments, a plurality of second bumps 40 are formed on the rewiring layer.

While the spirit and principles of the invention have been described with reference to several particular embodiments, it is to be understood that the invention is not limited to the disclosed embodiments, nor is the division of aspects, which is for convenience only as the features in such aspects may not be combined to benefit. The invention is intended to cover various modifications and equivalent arrangements included within the spirit and scope of the appended claims.

What is claimed is:

1. A package, comprising:
   at least two chips and an interconnect device, wherein the at least two chips are arranged side by side, each of the at least two chips has a front surface and a plurality of first bumps formed on the front surface, and the interconnect device has a first surface jointed to portions of the front surfaces of the at least two chips, whereby the at least two chips are electrically interconnected through the interconnect device;
   a molded package layer, wherein the at least two chips and the interconnect device are embedded in the molded package layer, the molded package layer exposing some of the plurality of first bumps of each of the at least two chips at a surface on one side of the molded package layer; and
   a plurality of second bumps formed on the one side of the molded package layer;
   wherein each chip has opposing first and second edge regions on a front surface facing the interconnect device, the package further comprising:
   a self-alignment device having opposing solder pad surface and insulation surface;
   wherein the insulation surface is at the surface on one side of the molded package layer where some of the plurality of first bumps of each of the at least two chips are exposed by the molded package layer, the solder pad surface is embedded inside the molded package layer, the first edge region of each chip is bonded to the first surface of the interconnect device in a self-aligned manner through solder balls, and the second edge region of each chip is bonded to the solder pad surface of the self-alignment device in a self-aligned manner through solder balls.

2. The package of claim 1, wherein:
   at least two groups of conductive bonding pads are formed on the first surface on one side of the interconnect device facing the at least two chips and configured to respectively bond to bumps in the first edge regions of the at least two chips; and
   a fan-out circuit is formed on the first surface of the interconnect device facing the at least two chips and configured to provide electrical connections between the at least two groups of conductive bonding pads.

3. The package of claim 1, wherein the interconnect device is formed as an active device or a passive device.

4. The package of claim 1, wherein the interconnect device has vertical interconnect vias.

5. The package of claim 1, wherein the interconnect device is formed as a flexible circuit that is thermocompression bonded to the front surfaces of the at least two chips.

6. The package of claim 1, wherein the self-alignment devices have same or similar arrangement and functions as the interconnect device.

7. The package of claim 1, further comprising:
   a redistribution layer formed on the surface on one side of the molded package layer, wherein the plurality of second bumps are formed on the redistribution layer.

8. The package of claim 1, wherein the plurality of second bumps are formed from a solder sealing layer formed on the surface on one side of the molded package layer.

9. The package of claim 1, wherein the interconnect device has a second surface opposite to the first surface, the second surface facing away from the at least two chips, and wherein the molded package layer further exposes the second surface of the interconnect device at the surface on the one side of the molded package layer.

10. A package, comprising:
    at least two chips, each of the at least two chips having a front surface and first bumps formed on the front surface, the at least two chips including a first chip and a second chip adjacently arranged side by side;
    at least one interconnect device, the at least one interconnect device including a respective interconnect device having a first side, a second side opposite to the first side, and first and second sets of conductive pads formed on the first side, the first set of conductive pads being respectively bonded to a first subset of the first bumps on the first chip, the second set of conductive pads being respectively bonded to a first subset of the first bumps on the second chip;
    a molded package layer embedding the at least two chips and the at least one interconnect device, the molded package layer exposing the second side of the respective interconnect device and top surfaces of some of the first bumps of each of the first and second chips on one side of the molded package layer;
    at least one self-alignment device, a respective self-alignment device of the at least one self-alignment device having opposing upper and lower sides, and solder pads formed on the upper side and respectively bonded to a second subset of the first bumps on a respective chip of the first and second chips, wherein the molded package layer further embeds the at least one self-alignment device while exposing the lower side of the respective self-alignment device on the one side of the molded package layer; and
    a plurality of second bumps formed on the one side of the molded package layer;
    wherein the first subset of the first bumps on the first chip are in a first edge region of the first chip, the second subset of the first bumps on the first chip are in a second edge region of the first chip, and the molded package layer exposes top surfaces of a third subset of the first bumps of the first chip, the third subset of the first bumps being in a region of the first chip between the first edge region and the second edge region.

11. The package of claim 10, wherein the respective interconnect device further includes a fan-out circuit formed on the first side of the interconnect device and configured to provide electrical connections between at least some of the first set of conductive pads and at least some of the second set of conductive pads.

12. The package of claim 10, wherein the respective interconnect device further includes conductive pads formed on the second side, and vertical interconnect vias, each vertical interconnect via connecting a conductive pad on the first side to a corresponding conductive pad on the second side.

13. The package of claim 12, wherein the respective self-alignment device does not have vertical interconnect vias between the upper and lower side.

14. The package of claim 10, further comprising:
a redistribution layer formed on the second side of the respective interconnect device and on the some of the first bumps of the first and second chips on the one side of the molded package layer, wherein the plurality of second bumps are formed on the redistribution layer.

15. The package of claim 10, wherein the respective interconnect device is a flexible circuit having a first surface on the first side and a second surface on the second side, and wherein a first portion of the first surface is thermocompression bonded to an edge portion of the front surface of the first chip, and a second portion of the first surface is thermocompression bonded to an edge portion of the front surface of the second chip.

16. A package, comprising:
first and second chips arranged side by side, each of the first and the second chips having a front surface and first bumps formed on the front surface;
an interconnect device having a first side, a second side opposite to the first side, and first and second sets of conductive pads formed on the first side, the first set of conductive pads being respectively bonded to a first subset of the first bumps of the first chip, the second set of conductive pads being respectively bonded to a first subset of the first bumps of the second chip;
first and second self-alignment devices, each self-alignment device of the first and second self-alignment devices having opposing upper and lower sides, and solder pads formed on the upper side, the solder pads on the upper side of the first self-alignment device being bonded to a second subset of the first bumps of the first chip, the solder pads on the upper side of the second self-alignment device being bonded to a second subset of the first bumps of the second chip;
a molded package layer embedding the first and second chips, the interconnect device, and the first and second self-alignment devices, the molded package layer exposing, on one side of the molded package layer, the second side of the interconnect device, the lower side of each of the first and second self-alignment devices, and top surfaces of a third subset of the first bumps of each of the first and second chips, wherein the first subset of the first bumps on the first chip are in a first edge region of the first chip, the second subset of the first bumps on the first chip are in a second edge region of the first chip, and the third subset of the first bumps on the first chip are in a region of the first chip between the first edge region and the second edge region; and
a plurality of second bumps formed on the one side of the molded package layer.

17. The package of claim 16, further comprising:
a redistribution layer formed on the second side of the interconnect device, the lower side of each of the first and second self-alignment devices, and the third subset of the first bumps of each of the first and second chips, wherein the plurality of second bumps are formed on the redistribution layer.

* * * * *